(12) United States Patent
Anderson

(10) Patent No.: US 11,418,156 B2
(45) Date of Patent: Aug. 16, 2022

(54) LOW NOISE AMPLIFIER WITH IMPROVED LINEARITY IN LOW GAIN MODE

(71) Applicant: DSP Group Ltd., Herzliya (IL)

(72) Inventor: Sergey Anderson, Netanya (IL)

(73) Assignee: DSP GROUP LTD., Herzliya (IL)

( * ) Notice: Subject to any disclaimer, the term of this patent is extended or adjusted under 35 U.S.C. 154(b) by 142 days.

(21) Appl. No.: 17/008,472

(22) Filed: Aug. 31, 2020

(65) Prior Publication Data

US 2021/0091730 A1 Mar. 25, 2021

Related U.S. Application Data

(60) Provisional application No. 62/903,844, filed on Sep. 22, 2019.

(51) Int. Cl.
*H03F 3/19* (2006.01)
*H03F 1/32* (2006.01)

(52) U.S. Cl.
CPC ............. *H03F 3/19* (2013.01); *H03F 1/32* (2013.01); *H03F 2200/294* (2013.01)

(58) Field of Classification Search
CPC ......... H03F 3/19; H03F 1/32; H03F 2200/294
USPC ........................................................ 330/250
See application file for complete search history.

(56) References Cited

U.S. PATENT DOCUMENTS

2017/0093343 A1* 3/2017 Xu ............................ H03F 3/72

* cited by examiner

*Primary Examiner* — Hafizur Rahman
(74) *Attorney, Agent, or Firm* — Reches Patents

(57) ABSTRACT

A low noise amplifier that includes a first cascode, a second cascode, an input circuit, an output node, a first switch, and a second switch. A source of a first common gate transistor and a drain of a first common source transistor of the first cascode are coupled to a first node of the low noise amplifier. The output node is coupled to a drain of the first common gate transistor, and to a drain of a second common gate transistor of the second cascode, thereby coupling the first cascode and the second cascode to a power supply via a load. The first switch is coupled between a gate of the first common gate transistor and the power supply. The second switch is coupled between the first node and the power supply. The first switch is configured to be open and the second switch is configured to be closed when the low noise amplifier operates at a first operational node. The first switch is configured to be closed and the second switch is configured to be open when the low noise amplifier operates at a second operational node that differs from the first operational mode by at least a gain of the low noise amplifier.

19 Claims, 8 Drawing Sheets

PRIOR ART

Configuring a low noise amplifier (LNA) to operate in a first operational node or in a second operational mode. The low noise amplifier may include a first cascode, a second cascode, an input circuit, an output node, a first switch, and a second switch; wherein the first cascode comprises a first common gate transistor and a first common source transistor that are serially coupled to each other, a source of the common gate transistor and a drain of the first common source transistor are coupled to first node of the low noise amplifier, the second cascode comprises a second common gate transistor and a second common source transistor that are serially coupled to each other, the first switch is coupled between a gate of the first common gate transistor and a power supply, the second switch is coupled between a first node and the power supply, and the output node is coupled to a drain of the first common gate transistor and to a drain of the second common gate transistor, thereby coupling the first cascode and the second cascode to the power supply via a load. 110

Configuring the LNA to operate in the first operational node by maintaining a first switch open and maintaining a second switch closed. 112

Configuring the LNA to operate in the first operational node by maintaining a first switch closed and maintaining a second switch open. 114

Receiving an input signal by an input circuit of the low noise amplifier, generating a second intermediate signal, amplifying the second intermediate signal by the second cascode to provide a second amplified signal and outputting to a load an output signal that substantially equals the second amplified signal. 120

Receiving an input signal by an input circuit of the low noise amplifier, generating a first intermediate signal and a second intermediate signal, amplifying the first intermediate signal by the first cascode to provide a first amplified signal, amplifying the second intermediate signal by the second cascode to provide a second amplified signal, and outputting to a load an output signal that substantially equals a sum of the first amplified signal and the second amplified signal. 140

Configuring a low noise amplifier (LNA) to operate in a first operational node or in a second operational mode. The LNA may include a first cascode, a second cascode, an input circuit, an output node, a first switch, a second switch, and a third switch. The first cascode comprises a first common gate transistor and a first common source transistor that are serially coupled to each other, a source of the common gate transistor and a drain of the first common source transistor are coupled to first node of the low noise amplifier, the second cascode comprises a second common gate transistor and a second common source transistor that are serially coupled to each other, the first switch is coupled between a gate of the first common gate transistor and a power supply, the second switch is coupled between a first node and the power supply, the third switch is connected between a source of the first common source transistor and the ground, the output node is coupled to a drain of the first common gate transistor and to a drain of the second common gate transistor, thereby coupling the first cascode and the second cascode to the power supply via a load 210

Configuring the LNA to operate in the first operational node by maintaining a first switch open, maintaining a second switch closed, and maintaining a third switch open. 212

Configuring the LNA to operate in the first operational node by maintaining a first switch closed, maintaining a second switch open, and maintaining a third switch closed. 214

Receiving an input signal by an input circuit of the low noise amplifier, generating a second intermediate signal, amplifying the second intermediate signal by the second cascode to provide a second amplified signal and outputting to a load an output signal that substantially equals the second amplified signal. 220

Receiving an input signal by an input circuit of the low noise amplifier, generating a first intermediate signal and a second intermediate signal, amplifying the first intermediate signal by the first cascode to provide a first amplified signal, amplifying the second intermediate signal by the second cascode to provide a second amplified signal, and outputting to a load an output signal that substantially equals a sum of the first amplified signal and the second amplified signal. 240

LOW NOISE AMPLIFIER WITH IMPROVED LINEARITY IN LOW GAIN MODE

CROSS REFERENCE

This application claims priority from U.S. provisional patent Ser. No. 62/903,844 filing date 22 Sep. 2019 which is incorporated herein by reference.

BACKGROUND

All wireless mobile devices (Bluetooth, DECT, GSM, 3G, LTE, WiMax, Wi-Fi 802.11 n/ac, ULE 802.11ah, IoT etc.) including low noise amplifiers (LNAs) and other amplifier devices require to be highly linear and meat the noise figure, gain, input return loss and frequency selectivity requirements.

It could be a challenging task when the LNA is based on Low Power CMOS process technologies where, on one hand, the linearity is limited by physical effects and core devices dimensions of the CMOS or other silicon processes. On the other hand, very low current consumption of the LNA is required for the modern IoT wireless devices.

Nowadays, the receive (Rx) line-up generally includes Automatic Gain Control (AGC) system with allows controlling overall system and single stage parameters such as noise figure, gain and linearity. For such approach, the LNA should support both high- and low-gain operating modes. In such case, for the high-gain mode LNA have to sustain relatively low noise figure, while for the low-gain mode—relatively high linearity performance.

FIG. 1 illustrates one the commonly-use technique to reduce the gain and reciprocally increase the linearity of the LNA 81 by adding parallel resistor (Radj 62) to the output load 60, the output load 60 is usually formed by resonant tank circuit. The LNA 81 includes a transistor M1' 41' and an input circuit that include an input port (IN) 31 and an input capacitor 32 coupled between the input port 31 and the gate of transistor M1'.

Indeed, such technique of reducing the gain and increasing the linearity of the LNA creates de-Q effect of the loaded LC-tank circuit and then reduces frequency selectivity of the LNA. It needs mentioning, that reducing the frequency selectivity of the LNA reduces the immunity to interferences not only for LNA, but also for all Rx system stages.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 7 illustrates an example of a method;
and
FIG. 8 illustrates an example of a method.

DETAILED DESCRIPTION OF THE DRAWINGS

Figure 1:
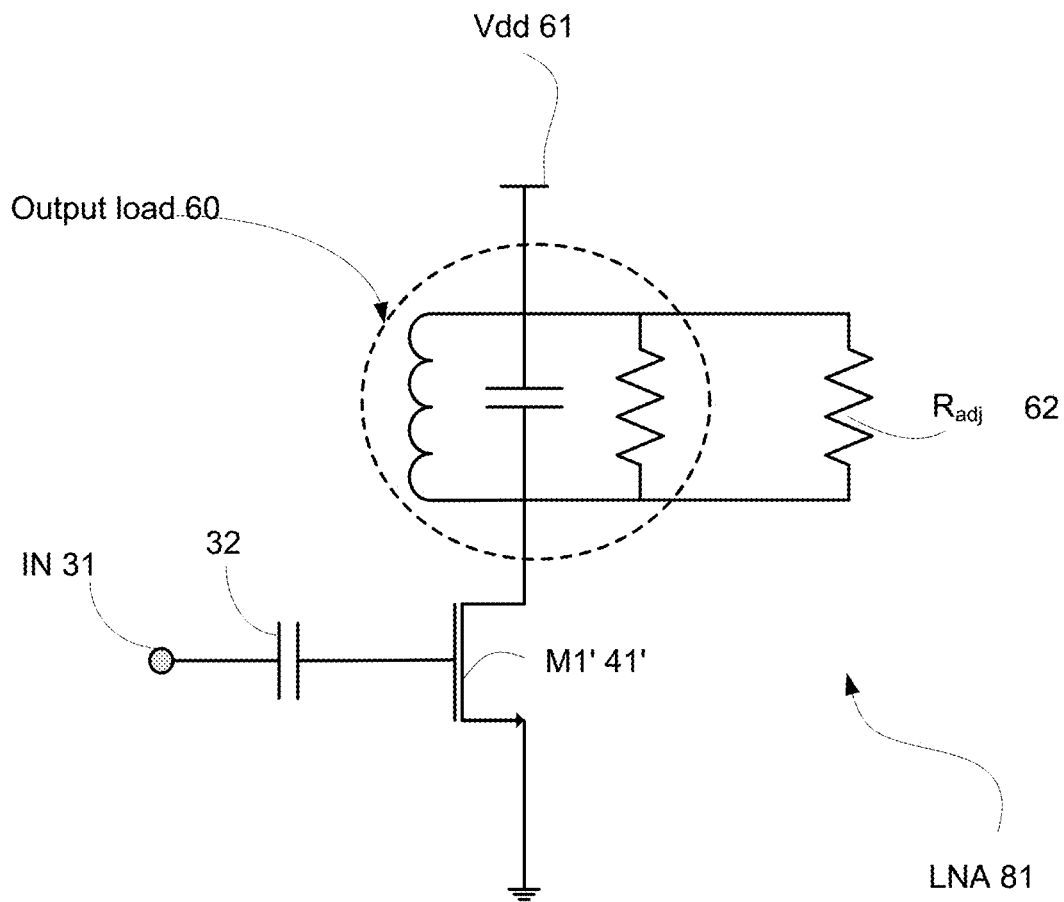
FIG. 1 illustrates an example of a low noise amplifier.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Any reference in the specification to a system should be applied mutatis mutandis to a method that can be executed by the system.

Because the illustrated at least one embodiment of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

A closed switch electrically connects the two ends of the switch. An open switch introduces a disconnection between the two ends of the switch.

Figure 2:
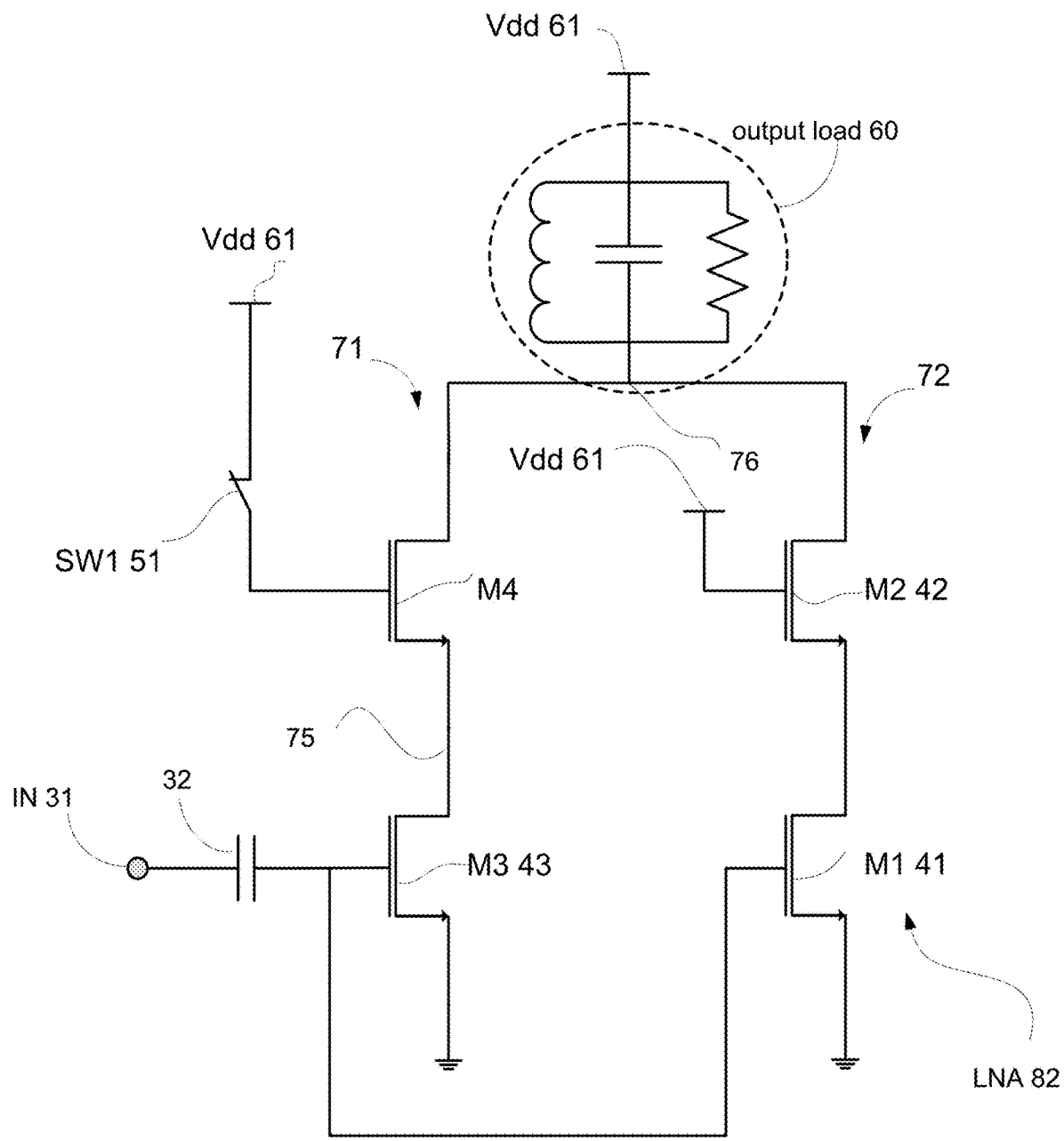
FIG. 2 illustrates an example of a low noise amplifier.

FIG. 2 illustrates an example of LNA 82 which operates in both high-gain ("HG") and low-gain ("LG") modes. Commonly, there is need to design two separated low nose high- and low-gain amplifiers and combine their output to the same output load—resonant tank circuit. However, in such case, the low-gain stage usually has lower Gm than the high-gain stage and therefore cannot sustain the loads from both resonant tank circuit and active elements of the high-gain stage. Moreover, using such technique defects the input return loss of the LNA in low-gain mode, especially for low-current LNA designs.

There may be provide an improved low noise amplifier (LNA) that has an integrated LNA topology that enables improving the linearity of the low-gain stage remaining the frequency selectivity and making more robust the LNA design and overall Rx system performances. As for today, RFIC LNA design could be presented with cascode circuit connection of common-source and common-gate transistors in series. The LNA may apply a Cascode Switched Shunt Control (CSSC) scheme for the high-gain cascode. This allows to improve the linearity of the low-gain cascode, while LNA operates in the low-gain mode. During the high-gain mode, the CSSC scheme does not influence on the LNA parameters.

The applying of the CSSC involves operating a first switch SW1 and a second switch SW2 so that one switch should be closed while the other switch is maintained open.

Figure 3:
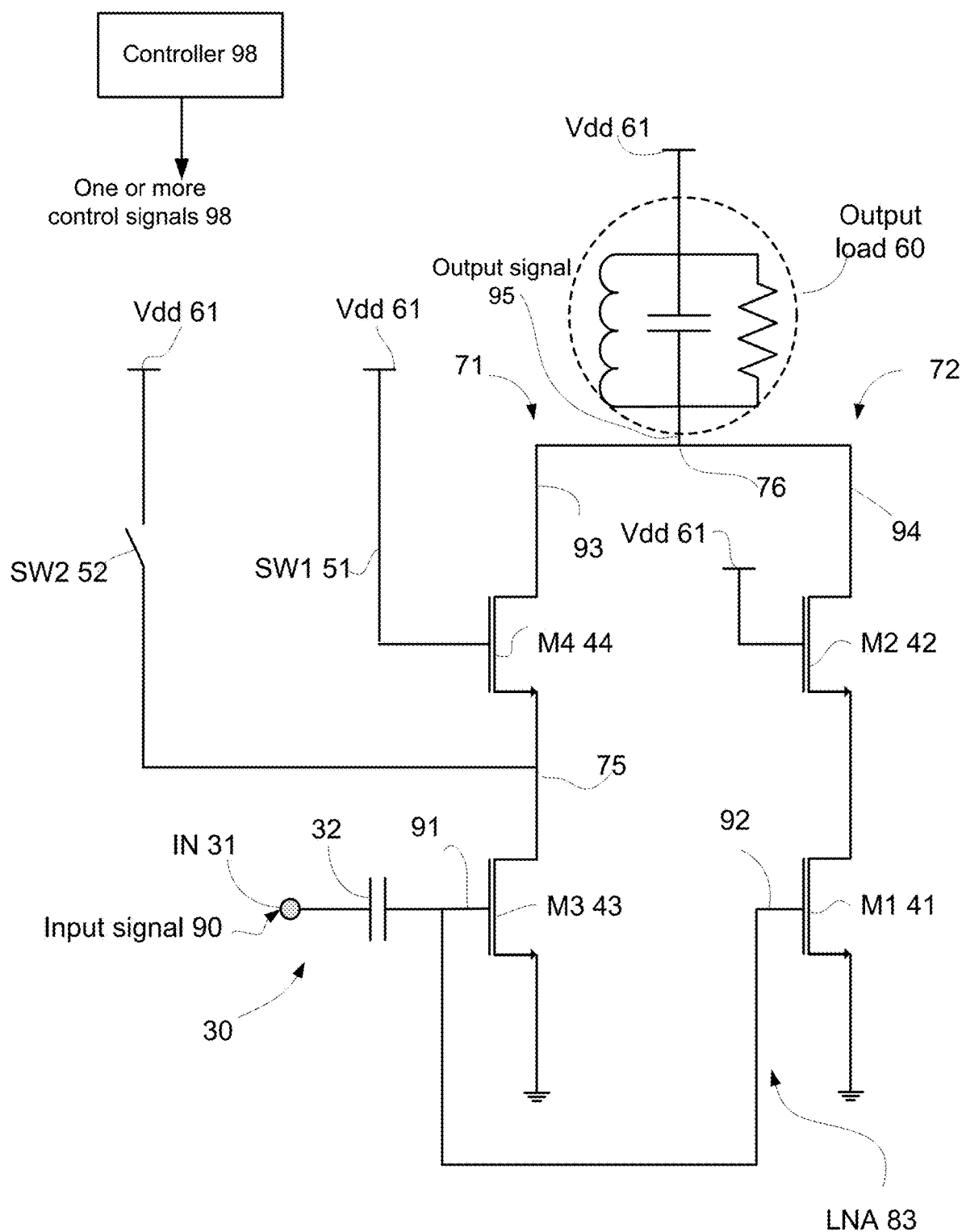
FIG. 3 illustrates an example of a low noise amplifier.

FIG. 3 illustrates an example of LNA 83 when operating at a second operational mode.

Figure 4:
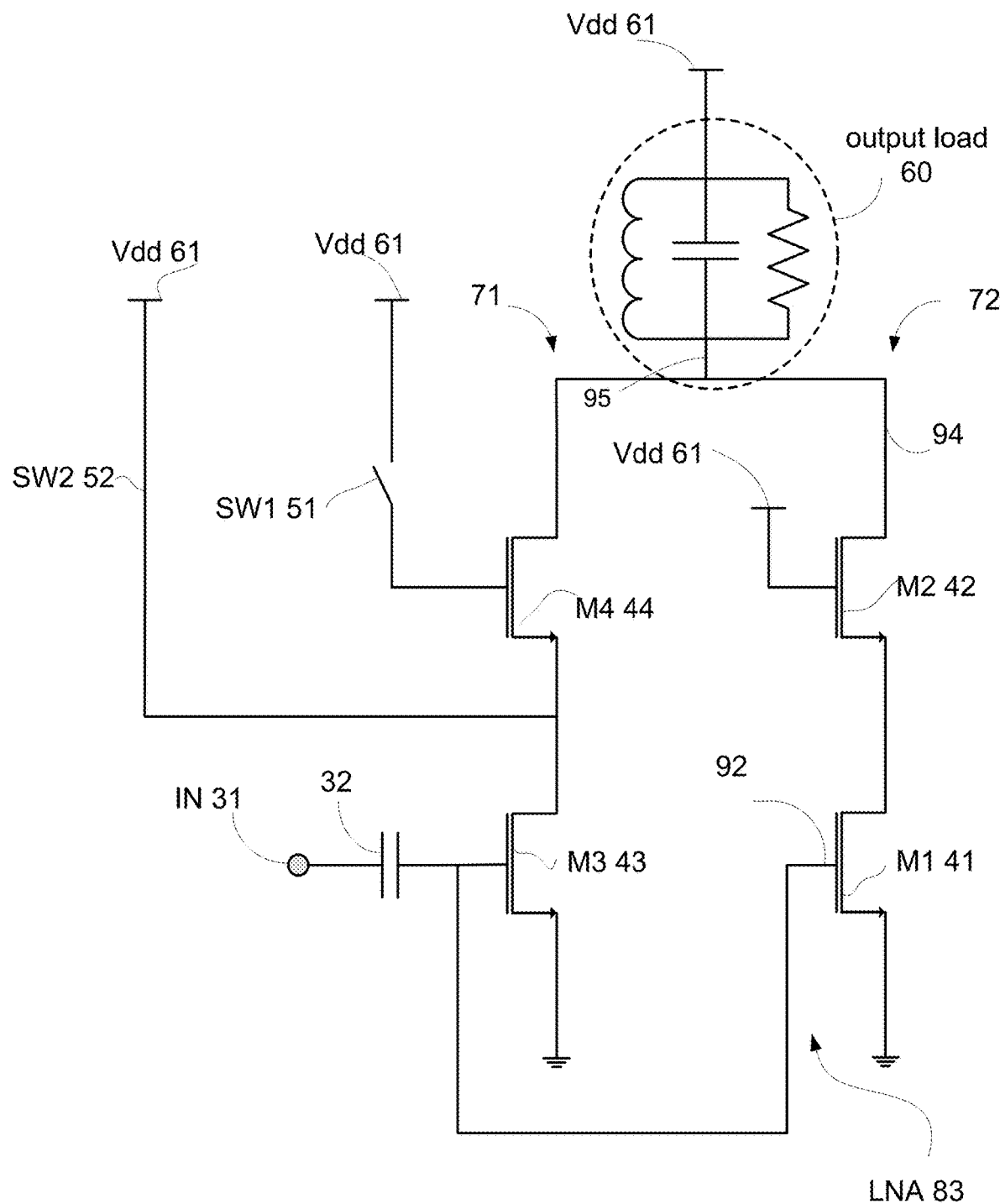
FIG. 4 illustrates an example of a low noise amplifier.

FIG. 4 illustrates an example of LNA 83 when operating at a first operational mode.

Referring to FIGS. 3 and 4—the LNA 83 includes first cascode 71, second cascode 72, input circuit 30, output node 76, first switch SW1 51, and second switch SW2 52.

First cascode 71 may include first common gate transistor M4 44 and first common source transistor M3 43 that are serially coupled to each other.

A source of first common gate transistor M4 44 and a drain of first common source transistor M3 43 are connected to the first node 75 of LNA 83.

Second cascode 72 includes a second common gate transistor M2 42 and a second common source transistor M1 41 that are serially coupled to each other.

Output node 76 is coupled to a drain of first common gate transistor M4 44, and to the drain of second common gate transistor M2 42, thereby coupling the first cascode and the second cascode to a power supply Vdd 61 via output load 60.

First switch SW1 51 is connected between the gate of first common gate transistor M4 44 and the power supply Vdd 61.

Second switch SW2 52 is coupled between the first node 75 and the power supply Vdd 61.

The first and second switches may be controlled by one or more control signals 98 sent aby a controller 99—according to the operational mode of the LNA 83.

First switch SW1 51 is a configured to be open when LNA 83 operates at a first operational node, and is configured to be closed when LNA 83 operates at a second operational mode.

The second operational mode differs from the first operational mode by at least a gain of the low noise amplifier.

For example—the second operational mode may be a high gain mode and the first operational mode may be a low gain mode.

Second switch SW 52 may be configured to be open when LNA 83 operates at the second operational node, and is configured to be closed when the LNA 83 operates at the first operational mode.

Referring to FIG. 3—when operating in the second operational mode, the closed first switch connects the gate of the first common gate transistor M4 44 to the power supply 44—and activates the first common gate transistor M4 44. The second switch is open—and does not change the state of the first common gate transistor M4 44. In this case—the first cascode 71 amplifies first intermediate signal 91 to provide first amplified signal 93, and the second cascode 72 amplifies second intermediate signal 92 to provide second amplified signal 94.

The first amplified signal 93, and the second amplified signal 94 are virtually added to each other at the output node 76 to provide an output signal 95 that substantially equals a sum of the first amplified signal 93 and the second amplified signal 94.

Referring to FIG. 4—when operating in the first operational mode, the open first switch disconnects the gate of the first common gate transistor M4 44 from the power supply 44—and deactivates the first common gate transistor M4 44. The second switch is closed—and coupled Vdd 61 to the first node 75—thereby to the source of the first common gate transistor M4 44 a voltage (Vdd) that may be equal to Vdd (in case there is no voltage drop on the output load 60) or higher than Vdd—thereby further reducing the conductivity of the first common gate transistor M4 44—and further reducing any leakage through the first cascode 71.

Accordingly—the first cascode will not receive any significant first intermediate signal and substantially the entire output of the input signal is the second intermediate signal that is amplified by the second cascode to provide the second amplified signal 94, and the output signal 95 substantially equals the second amplified signal 94.

Figure 5:
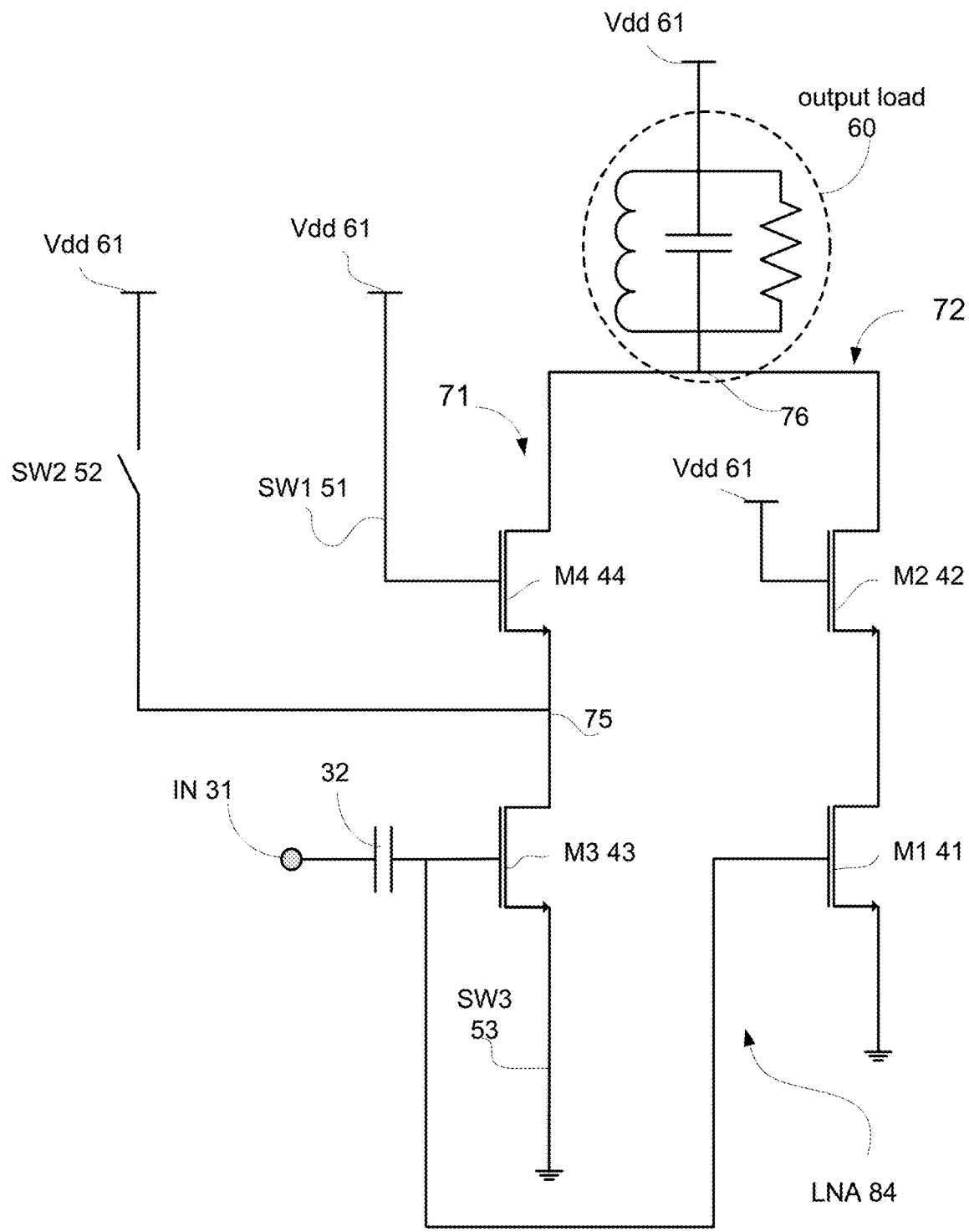
FIG. 5 illustrates an example of a low noise amplifier.

FIG. 5 illustrates an example of LNA 84 when operating at a second operational mode.

Figure 6:
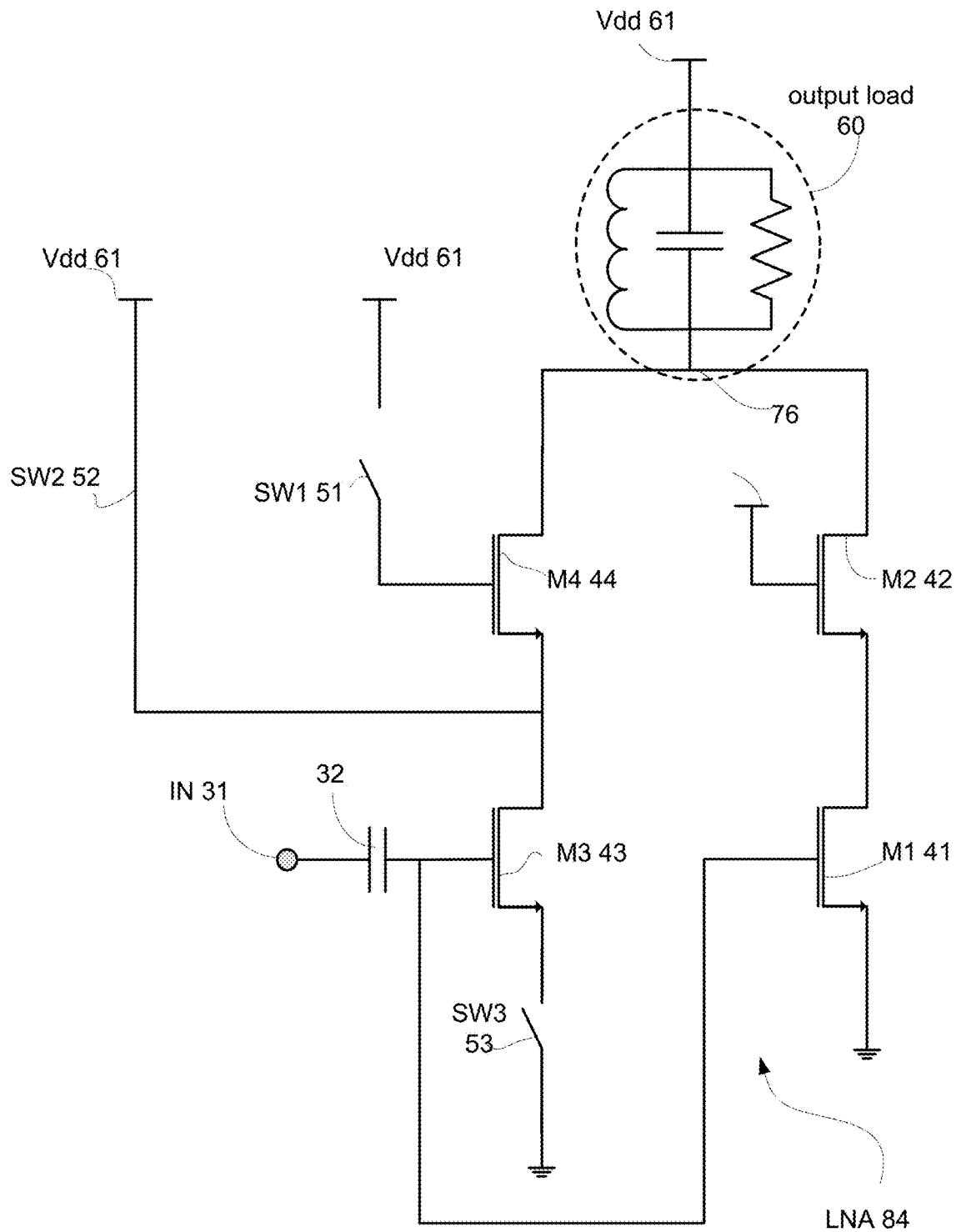
FIG. 6 illustrates an example of a low noise amplifier.

FIG. 6 illustrates an example of LNA 84 when operating at a first operational mode.

LNA 84 differs from LNA 83 by having third switch SW3 53.

Third switch SW3 53 is connected between the source of the first common source transistor M3 43 and a ground—or any other path to the ground or a fixed voltage.

Third switch SW3 53 is configured to be open when LNA 84 operates at the first operational mode, and is configured to be closed when the LNA 84 operates at the second operational mode.

When operating at the first operational node, the third switch disconnects the source of the first common source transistor M3 43—thereby further reduces the conductivity of first cascode 71 and further reduces any leakage through first cascode.

When operating in the second operational mode, the third switch does not affect the operation of the first cascode.

FIG. 7 illustrates method 100.

Method 100 may start by step 110.

Step 110 includes configuring a low noise amplifier (LNA) to operate in a first operational node or in a second operational mode. The selection between the operational modes may be reflected by control signals sent to the LNA.

Step 110 may include step 112 of configuring the LNA to operate in the first operational node by maintaining a first switch open and maintaining a second switch closed.

Step 110 may include step 114 of configuring the LNA to operate in the second operational node by maintaining a first switch closed and maintaining a second switch open.

The low noise amplifier may include a first cascode, a second cascode, an input circuit, an output node, a first switch, and a second switch; wherein the first cascode comprises a first common gate transistor and a first common source transistor that are serially coupled to each other, a source of the common gate transistor and a drain of the first common source transistor are coupled to first node of the low noise amplifier, the second cascode comprises a second common gate transistor and a second common source transistor that are serially coupled to each other, the first switch is coupled between a gate of the first common gate transistor and a power supply, the second switch is coupled between a first node and the power supply, and the output node is coupled to a drain of the first common gate transistor and to a drain of the second common gate transistor, thereby coupling the first cascode and the second cascode to the power supply via a load.

Step 112 may be followed by step 120 of receiving an input signal by an input circuit of the low noise amplifier, generating a second intermediate signal, amplifying the second intermediate signal by the second cascode to provide a second amplified signal and outputting to a load an output signal that substantially equals the second amplified signal.

Step 114 may be followed by step 140 of receiving an input signal by an input circuit of the low noise amplifier, generating a first intermediate signal and a second intermediate signal, amplifying the first intermediate signal by the first cascode to provide a first amplified signal, amplifying the second intermediate signal by the second cascode to provide a second amplified signal, and outputting to a load an output signal that substantially equals a sum of the first amplified signal and the second amplified signal.

FIG. 8 illustrates method 200.

Method 200 may start by step 210.

Step 210 includes configuring a low noise amplifier (LNA) to operate in a first operational node or in a second operational mode.

Step 210 may include step 212 of configuring the LNA to operate in the first operational node by maintaining a first switch open, maintaining a second switch closed, and maintaining a third switch open.

Step 210 may include step 214 of configuring the LNA to operate in the second operational node by maintaining a first switch closed, maintaining a second switch open, and maintaining a third switch closed.

The low noise amplifier may include a first cascode, a second cascode, an input circuit, an output node, a first switch, a second switch, and a third switch. The first cascode comprises a first common gate transistor and a first common source transistor that are serially coupled to each other, a source of the common gate transistor and a drain of the first common source transistor are coupled to first node of the low noise amplifier, the second cascode comprises a second common gate transistor and a second common source transistor that are serially coupled to each other, the first switch is coupled between a gate of the first common gate transistor and a power supply, the second switch is coupled between a first node and the power supply, the third switch is connected between a source of the first common source transistor and the ground, the output node is coupled to a drain of the first common gate transistor and to a drain of the second common gate transistor, thereby coupling the first cascode and the second cascode to the power supply via a load.

Step 212 may be followed by step 220 of receiving an input signal by an input circuit of the low noise amplifier, generating a second intermediate signal, amplifying the second intermediate signal by the second cascode to provide a second amplified signal and outputting to a load an output signal that substantially equals the second amplified signal.

Step 214 may be followed by step 240 of receiving an input signal by an input circuit of the low noise amplifier, generating a first intermediate signal and a second intermediate signal, amplifying the first intermediate signal by the first cascode to provide a first amplified signal, amplifying the second intermediate signal by the second cascode to provide a second amplified signal, and outputting to a load an output signal that substantially equals a sum of the first amplified signal and the second amplified signal.

Any of the figures may or may not be in scale.

Any reference to any of the terms "comprise", "comprises", "comprising" "including", "may include" and "includes" may be applied to any of the terms "consists", "consisting", "and consisting essentially of".

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between electronic elements are merely illustrative and that alternative embodiments may merge electronic elements or impose an alternate decomposition of functionality upon various electronic elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single electronic device. Alternatively, the examples may be implemented as any number of separate electronic devices or separate electronic devices interconnected with each other in a suitable manner. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A low noise amplifier that comprises:

a first cascode;

a second cascode;
an input circuit;
an output node;
a first switch, and
a second switch;
wherein the first cascode comprises a first common gate transistor and a first common source transistor that are serially coupled to each other; wherein a source of the first common gate transistor and a drain of the first common source transistor are coupled to a first node of the low noise amplifier;
wherein the second cascode comprises a second common gate transistor and a second common source transistor that are serially coupled to each other;
wherein the output node is coupled to a drain of the first common gate transistor, and to a drain of the second common gate transistor, thereby coupling the first cascode and the second cascode to a power supply via a load;
wherein the first switch is coupled between a gate of the first common gate transistor and the power supply;
wherein the second switch is coupled between the first node and the power supply;
wherein the first switch is configured to be open when the low noise amplifier operates at a first operational mode, and is configured to be closed when the low noise amplifier operates at a second operational mode, the second operational mode differs from the first operational mode by at least a gain of the low noise amplifier;
wherein the second switch is configured to be open when the low noise amplifier operates at the second operational mode, and is configured to be closed when the low noise amplifier operates at the first operational mode; and
wherein when the low noise amplifier operates at the first operational mode, the second cascode is configured to amplify a second intermediate signal while the first cascode is idle.

2. The low noise amplifier according to claim 1, wherein the input circuit is configured to receive an input signal and to output, when the low noise amplifier operates at the second operational mode, (a) a first intermediate signal to a gate of the first common source transistor, and (b) a second intermediate signal to a gate of the second first common source transistor.

3. The low noise amplifier according to claim 2 wherein the input circuit comprises a capacitor.

4. The low noise amplifier according to claim 2 wherein when the low noise amplifier operates at the second operational mode, the first cascode is configured to amplify the first intermediate signal to provide a first amplified signal, and the second cascode is configured to amplify the second intermediate signal to provide a second amplified signal.

5. The low noise amplifier according to claim 4 wherein when the low noise amplifier operates at the second operational mode, the output node is configured to provide to the load an output signal that substantially equals a sum of the first amplified signal and the second amplified signal.

6. The low noise amplifier according to claim 1 wherein the input circuit is configured to receive the input signal and to output, when the low noise amplifier operates at the first operational mode, a second intermediate signal to the gate of the second first common source transistor.

7. A low noise amplifier that comprises:
a first cascode;
a second cascode;
an input circuit;
an output node;
a first switch,
a second switch; and
a third switch;
wherein the first cascode comprises a first common gate transistor and a first common source transistor that are serially coupled to each other; wherein a source of the first common gate transistor and a drain of the first common source transistor are coupled to a first node of the low noise amplifier;
wherein the second cascode comprises a second common gate transistor and a second common source transistor that are serially coupled to each other;
wherein the output node is coupled to a drain of the first common gate transistor, and to a drain of the second common gate transistor, thereby coupling the first cascode and the second cascode to a power supply via a load;
wherein the first switch is coupled between a gate of the first common gate transistor and the power supply;
wherein the second switch is coupled between the first node and the power supply;
wherein the first switch is configured to be open when the low noise amplifier operates at a first operational mode, and is configured to be closed when the low noise amplifier operates at a second operational mode, the second operational mode differs from the first operational mode by at least a gain of the low noise amplifier;
wherein the second switch is configured to be open when the low noise amplifier operates at the second operational mode, and is configured to be closed when the low noise amplifier operates at the first operational mode; and
wherein the third switch is coupled between a source of the first common source transistor and a ground; wherein the third switch is configured to be open when the low noise amplifier operates at the first operational mode, and is configured to be closed when the low noise amplifier operates at the second operational mode.

8. The low noise amplifier according to claim 1 wherein a gain of the first cascode exceeds a gain of the second cascode.

9. The low noise amplifier according to claim 1 comprising a third switch that is coupled between a source of the first common source transistor and a ground; wherein the third switch is configured to be open when the low noise amplifier operates at the first operational mode, and is configured to be closed when the low noise amplifier operates at the second operational mode.

10. The low noise amplifier according to claim 1 wherein the input signal is a radio frequency input signal.

11. A method for operating a low noise amplifier, the method comprises:
receiving an input signal by an input circuit of the low noise amplifier, the low noise amplifier comprises a first cascode, a second cascode, an input circuit, an output node, a first switch, and a second switch; wherein the first cascode comprises a first common gate transistor and a first common source transistor that are serially coupled to each other, a source of the first common gate transistor and a drain of the first common source transistor are coupled to first node of the low noise amplifier, the second cascode comprises a second common gate transistor and a second common source transistor that are serially coupled to each other, the first switch is coupled between a gate of the first common gate transistor and a power supply, the second switch is coupled between a first node and the power supply, and the output node is coupled to a drain of the first common gate transistor and to a drain of the second common gate transistor, thereby coupling the first cascode and the second cascode to the power supply via a load, maintaining the first switch open and the second switch closed, when operating the low noise amplifier at a first operational mode;

maintaining the first switch closed and the second switch open, when operating the low noise amplifier at a second operational mode, wherein the second operational mode differs from the first operational mode by at least a gain of the low noise amplifier; and amplifying by the second cascode a second intermediate signal while the first cascode is idle, when operating the low noise amplifier at the first operational mode.

12. The method according to claim 11 comprising:
receiving, by the input circuit, an input signal; and
outputting, when operating the low noise amplifier at the second operational mode, (a) a first intermediate signal to a gate of the common source transistor, and (b) a second intermediate signal to a gate of the second first common source transistor.

13. The method according to claim 12 wherein the input circuit comprises a capacitor.

14. The method according to claim 12, comprising amplifying, by the first cascode, the first intermediate signal to provide a first amplified signal, and amplifying, by the second cascode, the second intermediate signal to provide a second amplified signal, when operating the low noise amplifier at the second operational mode.

15. The method according to claim 14 comprising outputting to the load an output signal that substantially equals a sum of the first amplified signal and the second amplified signal, when operating the low noise amplifier at the second operational mode.

16. The method according to claim 11 comprising:
receiving, by the input circuit, the input signal; and
outputting, when operating the low noise amplifier at the first operational mode, a second intermediate signal to the gate of the second first common source transistor.

17. The method according to claim 11 wherein a gain of the first cascode exceeds a gain of the second cascode.

18. The method according to claim 11 comprising maintaining a third switch of the low noise amplifier open when operating the low noise amplifier at the first operational mode, and maintaining the third switch closed when operating the low noise amplifier at the second operational mode, wherein the third switch is coupled between a source of the first common source transistor and the ground.

19. The method according to claim 11 wherein the input signal is a radio frequency input signal.

* * * * *

UNITED STATES PATENT AND TRADEMARK OFFICE
CERTIFICATE OF CORRECTION

| | |
|---|---|
| PATENT NO. | : 11,418,156 B2 |
| APPLICATION NO. | : 17/008472 |
| DATED | : August 16, 2022 |
| INVENTOR(S) | : Sergey Anderson |

It is certified that error appears in the above-identified patent and that said Letters Patent is hereby corrected as shown below:

In the Claims

Column 7: Line 44, Claim 2, please delete:
"intermediate signal to a gate of the second first common"
And please add:
--intermediate signal to a gate of the second common--

Column 7: Line 63, Claim 6, please delete:
"the second first common source transistor"
And please add:
--the second common source transistor--

Column 9: Line 25, Claim 12, please delete:
"second intermediate signal to a gate of the second first"
And please add:
--second intermediate signal to a gate of the second--

Column 10: Line 16, Claim 16, please delete:
"the gate of the second first common source transistor"
And please add:
--the gate of the second common source transistor--

Signed and Sealed this
Twenty-fifth Day of October, 2022

Katherine Kelly Vidal
*Director of the United States Patent and Trademark Office*